(12) United States Patent  
Brink et al.

(10) Patent No.: US 9,171,796 B1  
(45) Date of Patent: Oct. 27, 2015

(54) SIDEWALL IMAGE TRANSFER FOR HEAVY METAL PATTERNING IN INTEGRATED CIRCUITS

(71) Applicants: International Business Machines Corporation, Armonk, NY (US); Applied Materials, Incorporated, Santa Clara, CA (US)

(72) Inventors: Markus Brink, White Plains, NY (US); Michael A Guillorn, Yorktown, NY (US); Mark D Hoinkis, Fishkill, NY (US); Eric A Joseph, White Plains, NY (US); Hiroyuki Miyazoe, White Plains, NY (US); Bang N. To, Millwood, NY (US)

(73) Assignees: International Business Machines Corporation, Armonk, NY (US); Applied Materials, Incorporated, Santa Clara, CA (US)

( * ) Notice: Subject to any disclaimer, the term of this patent is extended or adjusted under 35 U.S.C. 154(b) by 0 days.

(21) Appl. No.: 14/309,371

(22) Filed: Jun. 19, 2014

(51) Int. Cl.
*H01L 29/40* (2006.01)
*H01L 23/498* (2006.01)
*H01L 21/768* (2006.01)
*H01L 23/50* (2006.01)

(52) U.S. Cl.
CPC .... *H01L 23/49872* (2013.01); *H01L 21/76846* (2013.01); *H01L 23/49894* (2013.01); *H01L 23/50* (2013.01)

(58) Field of Classification Search
CPC .................... H01L 21/76829; H01L 21/76841

USPC .......................................................... 257/773
See application file for complete search history.

(56) References Cited

U.S. PATENT DOCUMENTS

| | | |
|---|---|---|
| 3,615,951 A | 10/1971 | Franco et al. |
| 6,057,230 A | 5/2000 | Liu |
| 6,156,485 A | 12/2000 | Tang et al. |
| 6,355,979 B2 | 3/2002 | Tesauro et al. |
| 8,497,202 B1 | 7/2013 | Edelstein et al. |
| 2004/0219773 A1* | 11/2004 | Choi et al. ............. 438/597 |
| 2012/0164846 A1 | 6/2012 | Ha et al. |
| 2013/0032945 A1 | 2/2013 | Lin et al. |
| 2013/0032949 A1 | 2/2013 | Lin et al. |

FOREIGN PATENT DOCUMENTS

| | | |
|---|---|---|
| JP | 2006013307 A | 1/2006 |
| WO | WO 2011/056529 A2 | 5/2011 |
| WO | WO 2011/056529 A3 | 5/2011 |

* cited by examiner

*Primary Examiner* — Elias M Ullah
(74) *Attorney, Agent, or Firm* — Louis J. Percello

(57) ABSTRACT

A method for fabricating a plurality of conductive lines in an integrated circuit includes providing a layer of conductive metal in a multi-layer structure fabricated upon a wafer, forming a spacer in a layer of the multi-layer structure residing above the layer of conductive metal, wherein the spacer is formed from a metal-containing atomic layer deposition material, and transferring a pattern from the spacer to the layer of conductive metal using a sidewall image transfer technique, wherein the transferring results in a formation of the plurality of conductive lines in the layer of conductive material.

19 Claims, 5 Drawing Sheets

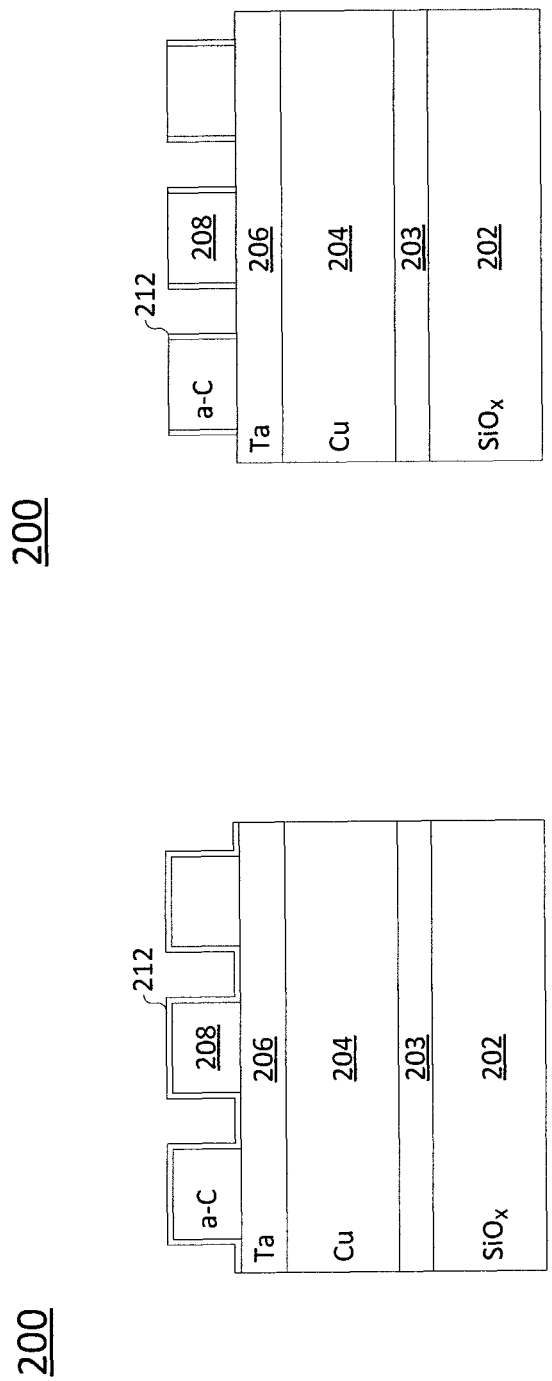

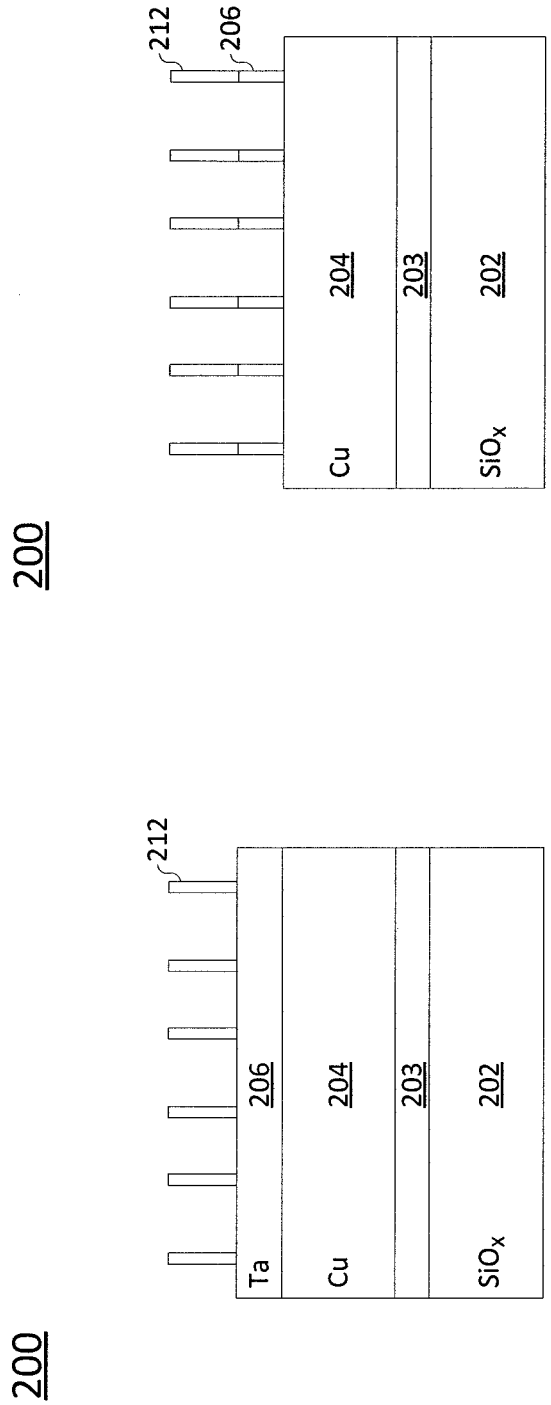

SIDEWALL IMAGE TRANSFER FOR HEAVY METAL PATTERNING IN INTEGRATED CIRCUITS

BACKGROUND OF THE INVENTION

The present invention relates generally to integrated circuits and relates more specifically to metal patterning processes for use in manufacturing integrated circuits.

Integrated circuits (ICs) commonly use copper interconnects (or "lines") to connect transistors and other semiconductor devices on the ICs. These interconnects are typically fabricated using an additive damascene process in which an underlying insulating layer (e.g., silicon oxide) is patterned with open trenches. FIG. 1, for example, is a schematic diagram illustrating a trench 100 that may be formed in the insulating layer during IC fabrication. A subsequent deposition of copper on the insulating layer fills the trenches with copper. The copper is removed to the top of the insulating layer, but remains within the trenches to form a patterned conductor. Successive layers of insulator and copper are formed according to this damascene process, resulting in a multilayer copper interconnect structure.

Conventional damascene processing such as that described above is not always compatible with the trend toward smaller feature sizes in modern complementary metal-oxide-semiconductor (CMOS) technology. For instance, modern CMOS technology may require lines having widths of less than forty nanometers and aspect ratios (i.e., line width:line height) of approximately 1:2. Attempting conventional damascene processing within these parameters often results in poor liner/seed coverage on the walls of the trenches (e.g., as illustrated at 102 in FIG. 1), pinch off at the mouths of the trenches (e.g., as illustrated at 104), and reentrant reactive ion etching profiles (e.g., as illustrated at 106). Consequently, the copper filling the trenches is subject to voids, defects, and poor adhesion to the trench liners. Moreover, as the lines narrow in size, the resistivity of the copper is increased (due to, for example, the thickness of the liner relative to the thickness of the copper, the small copper grain size, and copper grain boundary and surface scattering phenomena), resulting in decreased IC performance. In addition, it is difficult to obtain fine-pitch line-space structures (e.g., sixty nanometers or less) using conventional direct lithography processes on copper.

SUMMARY OF THE INVENTION

A method for fabricating a plurality of conductive lines in an integrated circuit includes providing a layer of conductive metal in a multi-layer structure fabricated upon a wafer, forming a spacer in a layer of the multi-layer structure residing above the layer of conductive metal, wherein the spacer is formed from a metal-containing atomic layer deposition material, and transferring a pattern from the spacer to the layer of conductive metal using a sidewall image transfer technique, wherein the transferring results in a formation of the plurality of conductive lines in the layer of conductive material.

Another embodiment of a method for fabricating a plurality of conductive lines in an integrated circuit includes providing a layer of conductive metal in a multi-layer structure fabricated upon a wafer, providing a barrier layer directly over the layer of conductive metal, providing a hard mask layer directly over the barrier layer, providing a photoresist layer directly over the hard mask layer, wherein the photoresist layer includes a first pattern, transferring the first pattern from the photoresist layer to the hard mask layer to form a patterned hard mask layer, depositing a layer of a metal-containing atomic layer deposition material over the patterned hard mask layer, etching a portion of the layer of the metal-containing atomic layer deposition material, wherein a portion of the layer of the metal-containing atomic layer deposition material that remains forms a plurality of spacers that collectively form a second pattern, removing the patterned hard mask layer, transferring the second pattern from the spacer to the barrier layer, and transferring the second pattern from the barrier layer to the layer of conductive metal, wherein the transferring the second pattern from the barrier layer to the layer of conductive metal results in a formation of the plurality of conductive lines in the layer of conductive metal.

An embodiment of an integrated circuit includes a plurality of semiconductor devices and a plurality of conductive lines connecting the plurality of semiconductor devices, wherein at least some of the plurality of conductive lines are fabricated by: providing a layer of conductive metal in a multi-layer structure fabricated upon a wafer, forming a spacer in a layer of the multi-layer structure residing above the layer of conductive metal, wherein the spacer is formed from a metal-containing atomic layer deposition material, and transferring a pattern from the spacer to the layer of conductive metal using a sidewall image transfer technique, wherein the transferring results in a formation of the plurality of conductive lines in the layer of conductive material.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-2G are schematic diagrams illustrating various stages of fabrication of a complementary metal-oxide-semiconductor device, according to embodiments of the present invention.

DETAILED DESCRIPTION

In one embodiment, the invention is a method and apparatus for heavy metal patterning using a sidewall image transfer process. Embodiments of the invention pattern fine metal lines on an insulating layer of an integrated circuit via a subtractive process (i.e., a process that creates a desired structure by removing material rather than by adding material). In a particular embodiment, the subtractive process uses metal-containing atomic layer deposition (ALD) materials, such as ALD metals, metal oxides, and/or metal nitrides (e.g., tantalum nitride (TaN) and/or hafnium oxide ($HfO_2$)) as spacer and mask materials during the etch of copper containing conductive metal. In particular, the disclosed process is capable of obtaining line-space structures having pitches smaller than those obtainable using conventional methods (e.g., pitches smaller than approximately sixty nanometers are possible using the disclosed process, and in further embodiments, the disclosed process can achieve line-space structures for ten nanometer nodes and beyond). It is easier to obtain a fine pitch in the mask structures and then transfer the pattern from those structures to the conductive metal.

FIGS. 2A-2G are schematic diagrams illustrating various stages of fabrication of a complementary metal-oxide-semiconductor (CMOS) device 200, according to embodiments of the present invention. As such, FIGS. 2A-2G also collectively serve as a flow diagram illustrating portions of one embodiment of a method for fabricating the CMOS device 200, according to the present invention.

Figure 1:
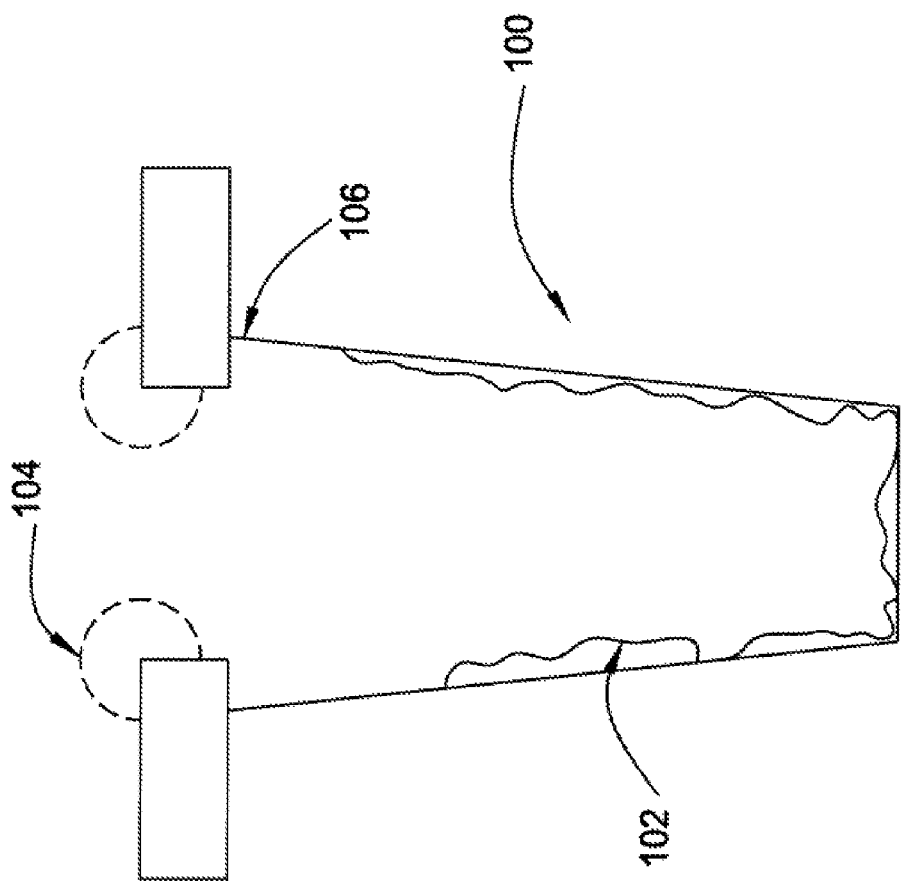
FIG. 1 is a schematic diagram illustrating a trench that may be formed during integrated circuit fabrication.
Figure 2B:
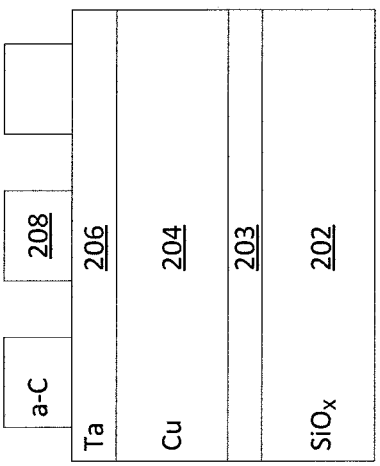
Figure 2A:
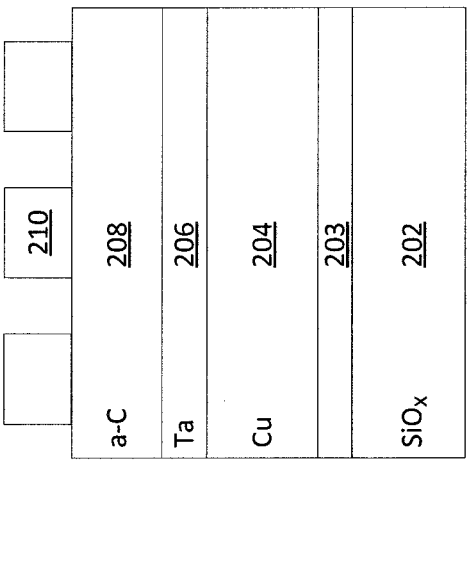

In particular, FIG. 2A illustrates the CMOS device 200 at an intermediate stage in the processing. For the purpose of clarity, several fabrication steps leading up to the production of the CMOS device 200 as illustrated in FIG. 2A are omitted. In other words, the CMOS device 200 does not start out in the form illustrated in FIG. 2A, but may develop into the illustrated structure over several well-known processing steps which are not illustrated but are well-known to those of skill in the art.

The CMOS device 200 generally comprises a plurality of layers deposited on a wafer (e.g., a silicon wafer) at this intermediate stage in the processing, including: a dielectric layer 202 (e.g., comprising silicon oxide ($SiO_x$), silicon nitride ($SiN_x$), ultra-low-k (ULK) materials, high-k materials, and/or other dielectric materials), a first liner layer 203 (e.g., comprising a combination of titanium and titanium nitride (Ti/TiN) or a combination of tantalum and tantalum nitride (Ta/TaN) formed on the dielectric layer 202, a conductive metal layer 204 (e.g., comprising copper (Cu), a copper alloy, gold (Au), nickel (Ni), cobalt (Co), or any other material that does not readily form a volatile species) formed on the first liner layer 203, a barrier layer 206 (e.g., comprising tantalum (Ta), titanium (Ti), tantalum nitride ($TaN_x$), titanium nitride ($TiN_x$), tungsten (W), nickel (Ni), platinum (Pt), ruthenium (Ru), gold (Au), aluminum (Al), aluminum oxide (AlO), and/or aluminum nitride (AlN)) formed on the conductive metal layer 204, a mask layer 208 (e.g., comprising amorphous carbon (a-C), silicon, silicon oxide, and/or silicon nitride) formed on the barrier layer 206, and a patternable resist layer 210 (e.g., comprising silicon-based electron beam resist, spin-on glass, dielectric film, metallic film, and/or any other material that can be patterned using any patterning technique) formed on the mask layer 208. In one embodiment, the dielectric layer 202 has a thickness of approximately eighty nanometers, the conductive metal layer 204 has a thickness of approximately forty nanometers, the barrier layer 206 has a thickness of approximately ten nanometers, and the mask layer 208 has a thickness of approximately forty nanometers.

FIG. 2A illustrates the CMOS device 200 after a pattern of very small structures has been formed in the patternable resist layer 210. In one embodiment, the patternable resist layer 210 is patterned using a photolithography technique, such as optical lithography or direct write electron beam lithography. In one embodiment, the photolithography technique includes a negative resist that allows removal of the patternable resist layer 210 down to the mask layer 208, except for the portions of the patternable resist layer 210 illustrated in FIG. 2A.

As illustrated in FIG. 2B, the pattern is transferred from the patternable resist layer 210 to the mask layer 208. In one embodiment, pattern transfer involves etching the mask layer 208 down to the barrier layer 206 (e.g., using a dry etch process such as reactive ion etching). Pattern transfer results in portions of the mask layer 208 being removed. For instance, in the embodiment illustrated in FIG. 2B, all portions of the mask layer 208 except for the portions residing directly beneath the patternable resist layer 210 are removed down to the barrier layer 206. The pattern transfer also removes the remaining portions of the patternable resist layer 210. This process results in a patterned mask layer 208.

As illustrated in FIG. 2C, spacers are next formed by first depositing a second liner layer 212 (e.g., comprising an ALD metal, an ALD metal oxide, or an ALD metal nitride, such as TaN or $HfO_2$) over the CMOS device 200. The second liner layer 212 conformally coats portions of the barrier layer 206 and the mask layer 208. In one embodiment, the second liner layer 212 is deposited by atomic layer deposition. In a further embodiment, the second liner layer 212 has a thickness of approximately ten nanometers.

As illustrated in FIG. 2D, a portion of the second liner layer 212 is next removed. In one embodiment, at least the portions of the second liner layer 212 that coat the barrier layer 206 and the horizontal portions of the mask layer 208 are removed; the portions of the second liner layer 212 coating the sidewalls of the mask layer 208 remain intact and form spacers. In one embodiment, the portions of the second liner layer 212 are removed via an etch process, such as reactive ion etching.

As illustrated in FIG. 2E, the mask layer 208 is next removed, leaving the spacers of the second liner layer 212. In one embodiment, the mask layer 208 is removed via an etch process, such as reactive ion etching.

As illustrated in FIG. 2F, an etch process is next used to transfer the pattern from the second liner layer 212 to barrier layer 206. In one embodiment, at least one plasma sputter etch process is used to remove a portion of the barrier layer 206, as illustrated in FIG. 2F. In particular, most of the barrier layer 206 except for the portions residing directly beneath the spacers of the second liner layer 212 are removed down to the conductive metal layer 204.

Figure 2G:
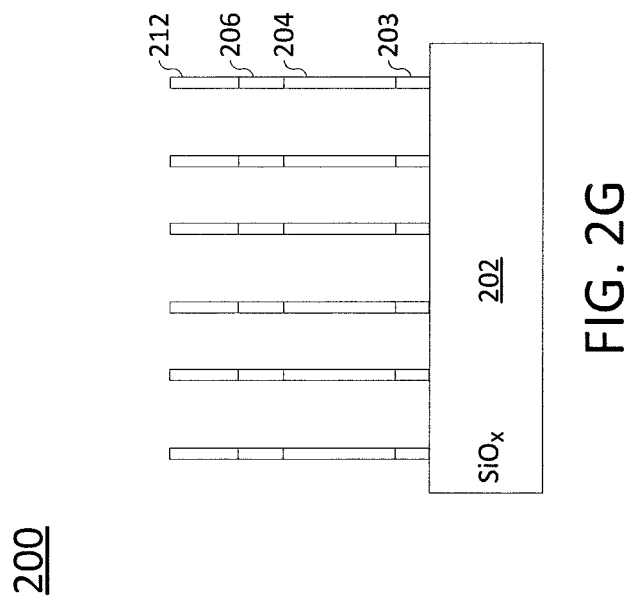

As illustrated in FIG. 2G, an etch process is next used to transfer the pattern from barrier layer 206 to the conductive metal layer 204. In the embodiment illustrated in FIG. 2G, the conductive metal layer 204 is etched down to the dielectric layer 202, except for the portions of the conductive metal layer 204 residing directly beneath the barrier layer 206. The remaining portions of the conductive metal layer 204 form one or more thin metal lines or interconnects. In one embodiment, the resultant line-space structure has a pitch that is approximately sixty nanometers or smaller.

Although not illustrated, additional etch processes may be used to remove the remaining portions of the second liner layer 212 (i.e., the spacers) and the barrier layer 206.

Embodiments of the invention thus pattern fine metal lines on an insulating layer of an integrated circuit via a subtractive process that uses metal-containing ALD materials (e.g., ALD metals, ALD metal oxides, and/or ALD metal nitrides) as spacer and mask materials during the etch of copper containing conductive metal. In some embodiments, the mask materials are selected to be compatible with sidewall image transfer as a sub-lithographic patterning extension. This increases the pattern resolution during transfer. In particular, the disclosed process is capable of obtaining line-space structures having pitches that are approximately sixty nanometers or smaller. In further embodiments, the disclosed process can achieve line-space structures for ten nanometer nodes and beyond.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A method for fabricating a plurality of conductive lines in an integrated circuit, the method comprising:
    providing a layer of conductive metal in a multi-layer structure fabricated upon a wafer;
    forming a plurality of spacers in a layer of the multi-layer structure residing above the layer of conductive metal, wherein the plurality of spacers is formed from a metal-containing atomic layer deposition material; and
    transferring a first pattern from the plurality of spacers to the layer of conductive metal using a sidewall image transfer technique, wherein the transferring results in a formation of the plurality of conductive lines in the layer of conductive metal.

2. The method of claim 1, further comprising:
    providing a barrier layer directly over the layer of conductive metal;
    providing a mask layer directly over the barrier layer; and
    providing a patternable resist layer directly over the mask layer, wherein the patternable resist layer includes a second pattern.

3. The method of claim 2, wherein the forming the spacer comprises:
    transferring the second pattern from the patternable resist layer to the mask layer to form a patterned mask layer;
    depositing a layer of the atomic layer deposition metal over the patterned mask layer; and
    etching a portion of the layer of the metal-containing atomic layer deposition material, wherein a portion of the layer of the metal-containing atomic layer deposition material that remains forms the plurality of spacers.

4. The method of claim 3, wherein the transferring comprises:
    removing the patterned mask layer;
    transferring the first pattern from the spacer to the barrier layer; and
    transferring the first pattern from the barrier layer to the layer of conductive metal.

5. The method of claim 2, wherein the barrier layer comprises tantalum.

6. The method of claim 2, wherein the mask layer comprises carbon.

7. The method of claim 1, wherein the conductive metal comprises copper.

8. The method of claim 1, wherein the conductive metal comprises a copper alloy.

9. The method of claim 1, wherein the conductive metal comprises gold.

10. The method of claim 1, wherein the conductive metal comprises nickel.

11. The method of claim 1, wherein the conductive metal comprises cobalt.

12. The method of claim 1, wherein the metal-containing atomic layer deposition material comprises an atomic layer deposition metal oxide.

13. The method of claim 12, wherein the atomic layer deposition metal oxide is hafnium oxide.

14. The method of claim 12, wherein the atomic layer deposition metal nitride is tantalum nitride.

15. The method of claim 1, wherein the metal-containing atomic layer deposition material comprises an atomic layer deposition metal nitride.

16. The method of claim 1, wherein a line-space structure of the plurality of conductive lines has a pitch of sixty nanometers or less.

17. A method for fabricating a plurality of conductive lines in an integrated circuit, the method comprising:
    providing a layer of conductive metal in a multi-layer structure fabricated upon a wafer;
    providing a barrier layer directly over the layer of conductive metal;
    providing a mask layer directly over the barrier layer;
    providing a patternable resist layer directly over the mask layer, wherein the patternable resist layer includes a first pattern;
    transferring the first pattern from the patternable resist layer to the mask layer to form a patterned mask layer;
    depositing a layer of a metal-containing atomic layer deposition material over the patterned mask layer;
    etching a portion of the layer of the metal-containing atomic layer deposition material, wherein a portion of the layer of the metal-containing atomic layer deposition material that remains forms a plurality of spacers that collectively form a second pattern;
    removing the patterned mask layer;
    transferring the second pattern from the spacer to the barrier layer; and
    transferring the second pattern from the barrier layer to the layer of conductive metal, wherein the transferring the second pattern from the barrier layer to the layer of conductive metal results in a formation of the plurality of conductive lines in the layer of conductive metal.

18. The method of claim 17, wherein the metal-containing atomic layer deposition material comprises an atomic layer deposition metal oxide.

19. The method of claim 17, wherein the metal-containing atomic layer deposition material comprises an atomic layer deposition metal nitride.

* * * * *